United States Patent
Hinkle et al.

(10) Patent No.: US 9,787,033 B2
(45) Date of Patent: Oct. 10, 2017

(54) CARD CONNECTOR SYSTEM WITH HEAT DISSIPATION AND ELECTROMAGNETIC INTERFERENCE (EMI) SHIELDING

(71) Applicant: Lenovo Enterprise Solutions (Singapore) Pte. Ltd., Singapore (SG)

(72) Inventors: Jonathan Randall Hinkle, Morrisville, NC (US); Yasushi Honda, Chigasaki (JP); Shiro Konaka, Kawasaki (JP); Jason A. Matteson, Raleigh, NC (US); Shigefumi Odaohhara, Yamato (JP)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 14/934,580

(22) Filed: Nov. 6, 2015

(65) Prior Publication Data

US 2017/0133794 A1 May 11, 2017

(51) Int. Cl.
*H01R 13/6581* (2011.01)
*H01R 12/72* (2011.01)

(52) U.S. Cl.
CPC ....... *H01R 13/6581* (2013.01); *H01R 12/721* (2013.01)

(58) Field of Classification Search
CPC .................. H01R 12/79; H01R 23/688; H01R 13/65807; H01R 23/684; H01R 23/7005; H01R 23/7073; H05K 7/2039–7/20418; H05K 7/20454; H05K 7/20472–7/20481; H01L 23/40; H01L 23/467; H01L 23/7073

USPC ...... 439/487, 607.07, 607.06, 260; 361/704–711, 715–716, 719, 720; 165/80.2, 80.3, 80.5; 257/721–722, 706, 257/707, 712, 713

See application file for complete search history.

(56) References Cited

U.S. PATENT DOCUMENTS

| | | | | |
|---|---|---|---|---|
| 3,602,870 A | * | 8/1971 | Willard | H05K 3/365 439/493 |
| 4,449,775 A | * | 5/1984 | de Pommery | G06K 7/0017 235/441 |
| 4,592,610 A | * | 6/1986 | Bowls | H05K 7/1418 211/41.17 |
| 4,983,935 A | * | 1/1991 | Mouissie | H01R 13/7195 333/184 |

(Continued)

OTHER PUBLICATIONS

U.S. Appl. No. 14/737,430, filed Jun. 11, 2015.

*Primary Examiner* — Gary Paumen
(74) *Attorney, Agent, or Firm* — Zilka-Kotab, P.C.

(57) ABSTRACT

A system according to one embodiment includes opposing slide plates, and opposing guide blocks configured to receive the slide plates therebetween and push the slide plates together during a relative motion between the slide plates and the guide blocks. A system according to another embodiment includes opposing slide plates and a thermal interface material coupled to opposing inner faces of the slide plate. Opposing guide blocks are configured to receive the slide plates therebetween and push the slide plates together during a relative motion between the slide plates and the guide blocks. An interface connector is coupled to at least one of the guide blocks and the slide plates, the interface connector having electrical connectors on opposite ends thereof.

20 Claims, 7 Drawing Sheets

(56) References Cited

U.S. PATENT DOCUMENTS

| | | | | |
|---|---|---|---|---|
| 5,191,514 A | * | 3/1993 | Kabat | H05K 7/1418 |
| | | | | 211/41.17 |
| 5,467,254 A | * | 11/1995 | Brusati | H05K 7/1409 |
| | | | | 174/355 |
| 6,030,251 A | * | 2/2000 | Stark | H01R 12/7005 |
| | | | | 439/377 |
| 6,033,253 A | * | 3/2000 | Yi | H01R 13/24 |
| | | | | 439/377 |
| 6,231,391 B1 | * | 5/2001 | Ramey | H01R 12/585 |
| | | | | 439/607.07 |
| 6,272,010 B1 | * | 8/2001 | Schmitt | G06F 1/184 |
| | | | | 361/679.31 |
| 7,967,638 B1 | * | 6/2011 | Kline | H01R 12/7082 |
| | | | | 439/607.07 |

* cited by examiner

CARD CONNECTOR SYSTEM WITH HEAT DISSIPATION AND ELECTROMAGNETIC INTERFERENCE (EMI) SHIELDING

FIELD OF THE INVENTION

The present invention relates to card edge connections, and more particularly, this invention relates to heat dissipation and electromagnetic shielding interference (EMI) shielding of a card.

BACKGROUND

Currently, separate heatsinks may be employed by various semiconductor devices and modules for facilitating heat transfer from the semiconductor devices to an external environment. The separate heatsinks often do not include additional conduction paths for further systemic heatsinking or clamp load (may herein referred to as "normal force") that may be automatically applied to the semiconductor devices.

Further conventional conduction efforts include mounting a conduction system to an electronics component before the component is used in a card connector system. These conduction efforts may not provide for integrated coupling with connectors, and in sharp contrast may crowd the system in which they are implemented.

SUMMARY

A system according to one embodiment includes opposing slide plates, and opposing guide blocks configured to receive the slide plates therebetween and push the slide plates together during a relative motion between the slide plates and the guide blocks.

A system according to another embodiment includes opposing slide plates and a thermal interface material coupled to opposing inner faces of the slide plate. Opposing guide blocks are configured to receive the slide plates therebetween and push the slide plates together during a relative motion between the slide plates and the guide blocks. An interface connector is coupled to at least one of the guide blocks and the slide plates, the interface connector having electrical connectors on opposite ends thereof.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of orthogonal card to circuit board electrical connections and/or related systems and methods. Embodiments described herein include thermally cooling and EMI shielding surface areas which establish heatsink conduction pathways, and apply normal force to an inserted electronics card.

In one general embodiment, a system according includes opposing slide plates, and opposing guide blocks configured to receive the slide plates therebetween and push the slide plates together during a relative motion between the slide plates and the guide blocks.

In another general embodiment, a system includes opposing slide plates and a thermal interface material coupled to opposing inner faces of the slide plate. Opposing guide blocks are configured to receive the slide plates therebetween and push the slide plates together during a relative motion between the slide plates and the guide blocks. An interface connector is coupled to at least one of the guide blocks and the slide plates, the interface connector having electrical connectors on opposite ends thereof.

The description herein is presented to enable any person skilled in the art to make and use the invention and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

In particular, various embodiments of the invention discussed herein are implemented using the Internet as a means of communicating among a plurality of computer systems. One skilled in the art will recognize that the present invention is not limited to the use of the Internet as a communication medium and that alternative methods of the invention may accommodate the use of a private intranet, a Local Area Network (LAN), a Wide Area Network (WAN) or other means of communication. In addition, various combinations of wired, wireless (e.g., radio frequency) and optical communication links may be utilized.

The program environment in which one embodiment of the invention may be executed illustratively incorporates one or more general-purpose computers or special-purpose devices such hand-held computers. Details of such devices (e.g., processor, memory, data storage, input and output devices) are well known and are omitted for the sake of clarity.

It should also be understood that the techniques of the present invention might be implemented using a variety of technologies. For example, the methods described herein may be implemented in software running on a computer system, or implemented in hardware utilizing one or more processors and logic (hardware and/or software) for performing operations of the method, application specific integrated circuits, programmable logic devices such as Field Programmable Gate Arrays (FPGAs), and/or various combinations thereof. In one illustrative approach, methods described herein may be implemented by a series of computer-executable instructions residing on a storage medium such as a physical (e.g., non-transitory) computer-readable medium. In addition, although specific embodiments of the invention may employ object-oriented software programming concepts, the invention is not so limited and is easily adapted to employ other forms of directing the operation of a computer.

The invention can also be provided in the form of a computer program product comprising a computer readable storage or signal medium having computer code thereon, which may be executed by a computing device (e.g., a processor) and/or system. A computer readable storage medium can include any medium capable of storing computer code thereon for use by a computing device or system, including optical media such as read only and writeable CD and DVD, magnetic memory or medium (e.g., hard disk drive, tape), semiconductor memory (e.g., FLASH memory and other portable memory cards, etc.), firmware encoded in a chip, etc.

A computer readable signal medium is one that does not fit within the aforementioned storage medium class. For example, illustrative computer readable signal media communicate or otherwise transfer transitory signals within a system, between systems e.g., via a physical or virtual network, etc.

Figure 1:
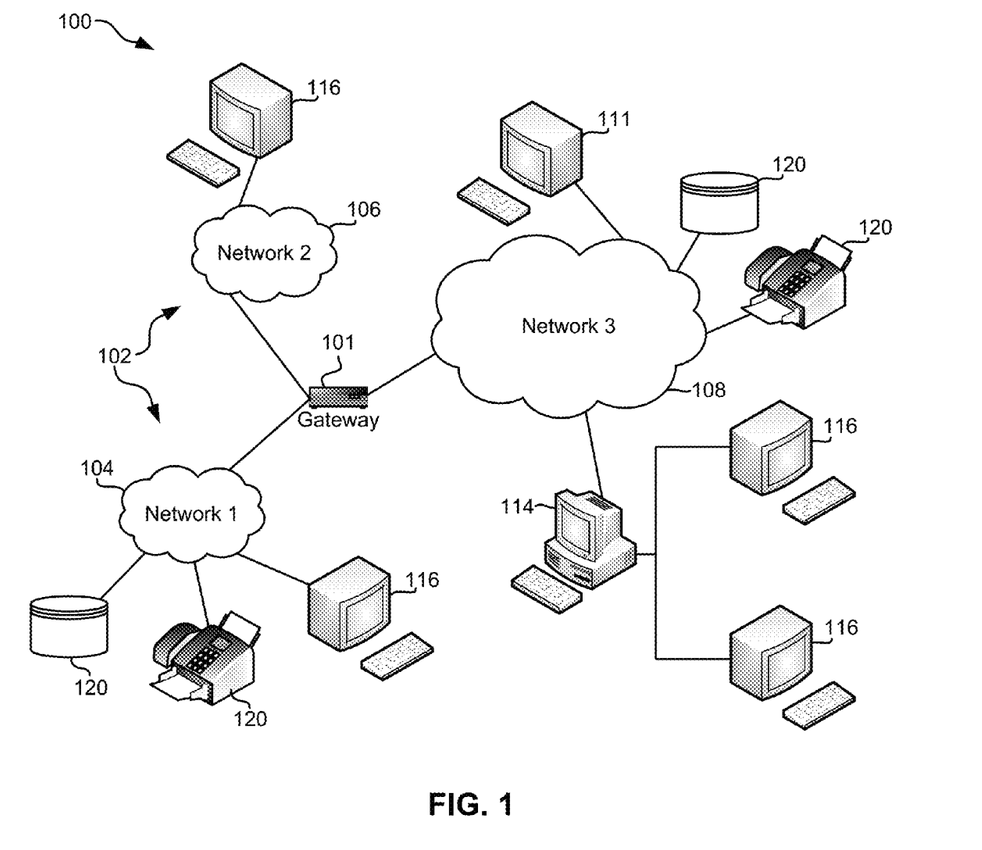
FIG. 1 is a network architecture, in accordance with one embodiment.

FIG. 1 illustrates an architecture 100, in accordance with one embodiment. As an option, the present architecture 100 may be implemented in conjunction with features from any other embodiment listed herein, such as those described with reference to the other FIGS. Of course, however, such architecture 100 and others presented herein may be used in various applications and/or in permutations which may or may not be specifically described in the illustrative embodiments listed herein. Further, the architecture 100 presented herein may be used in any desired environment.

As shown in FIG. 1, a plurality of remote networks 102 are provided including a first remote network 104 and a second remote network 106. A gateway 101 may be coupled between the remote networks 102 and a proximate network 108. In the context of the present network architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. Such user devices 116 may include a desktop computer, laptop computer, hand-held computer, printer or any other type of logic. It should be noted that a user device 111 may also be directly coupled to any of the networks, in one embodiment.

A peripheral 120 or series of peripherals 120, e.g. facsimile machines, printers, networked storage units, etc., may be coupled to one or more of the networks 104, 106, 108. It should be noted that databases, servers, and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates a MAC OS environment, a UNIX system which virtually hosts a MICROSOFT WINDOWS environment, a MICROSOFT WINDOWS system which emulates a MAC OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data processing and/or storage, servers, etc., are provided to any system in the cloud, preferably in an on-demand relationship, thereby allowing access and distribution of services across many computing systems. Cloud computing typically involves an Internet or other high speed connection (e.g., 4G LTE, fiber optic, etc.) between the systems operating in the cloud, but other techniques of connecting the systems may also be used.

Figure 2:
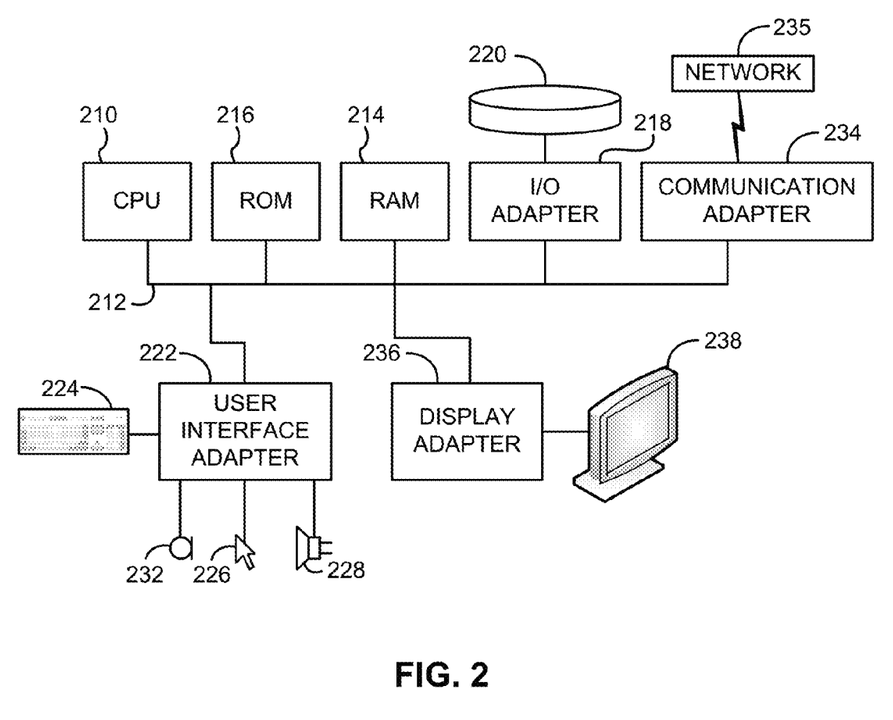
FIG. 2 shows a representative hardware environment that may be associated with the servers and/or clients of FIG. 1.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an I/O adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Conventional card edge connector systems may become overheated as a result of functional current passing through the connector leads and/or the circuitry of an electronics card that is coupled to the card edge connector system. In efforts to cool the electronics card and/or the card edge connector system, conventional card edge connector systems may include high density separate heatsinks and mounted conduction systems. These separate heatsinks and mounted conduction systems often overcrowd the card edge connector systems and thereby do not provide thermally efficient cooling of the system.

Embodiments described herein include a service friendly clam shell-type heat sink design, which maximizes contacted surface areas for thermal dissipation efficiency, applies a normal force to an inserted electronics card and/or chips on an inserted electronics card to establish preferred thermal conduction pathways, and provides EMI shielding.

Figure 3A:
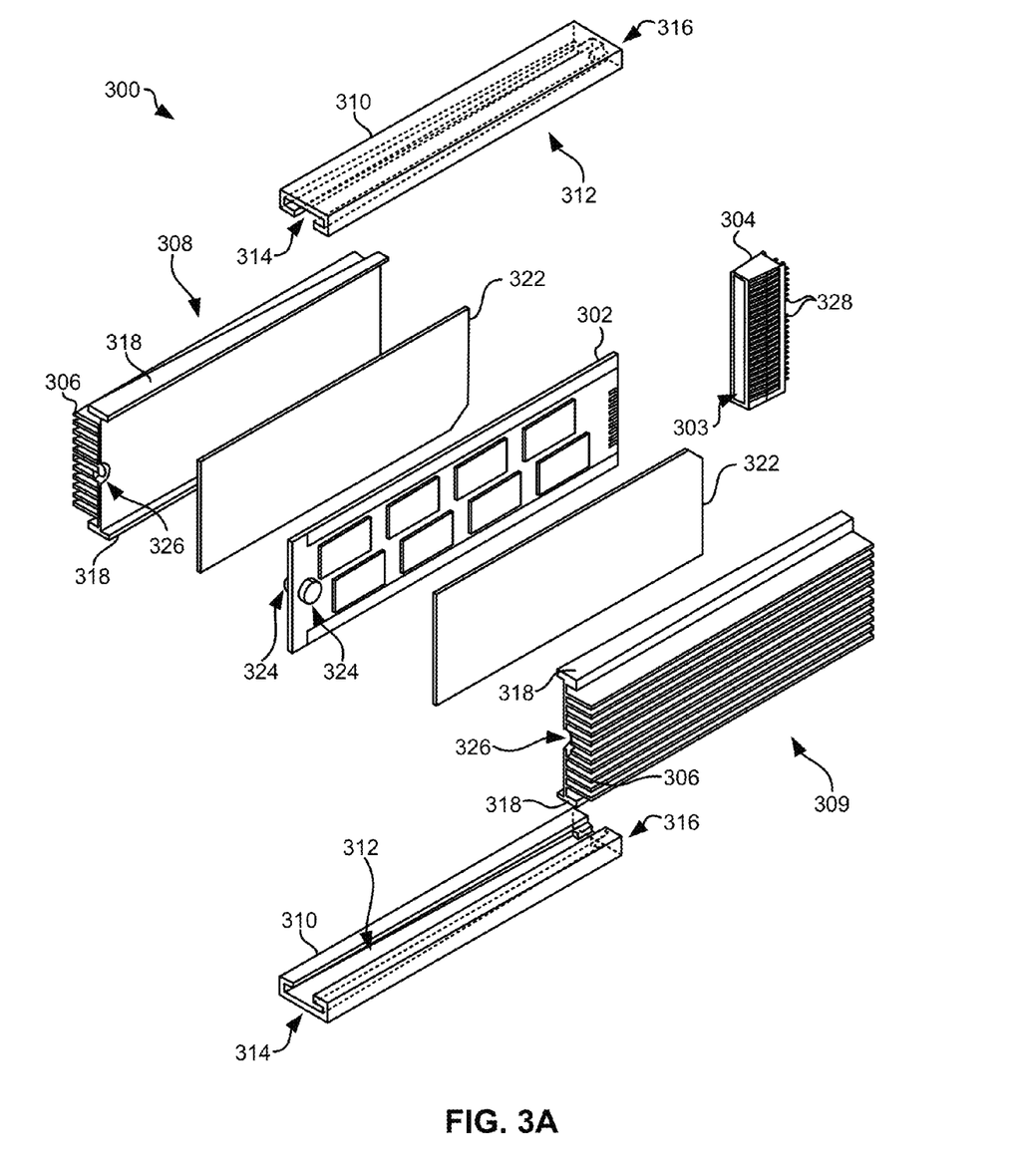
FIG. 3A is an exploded view of a card connector system and an electronics card, in accordance with one embodiment.
Figure 3B:
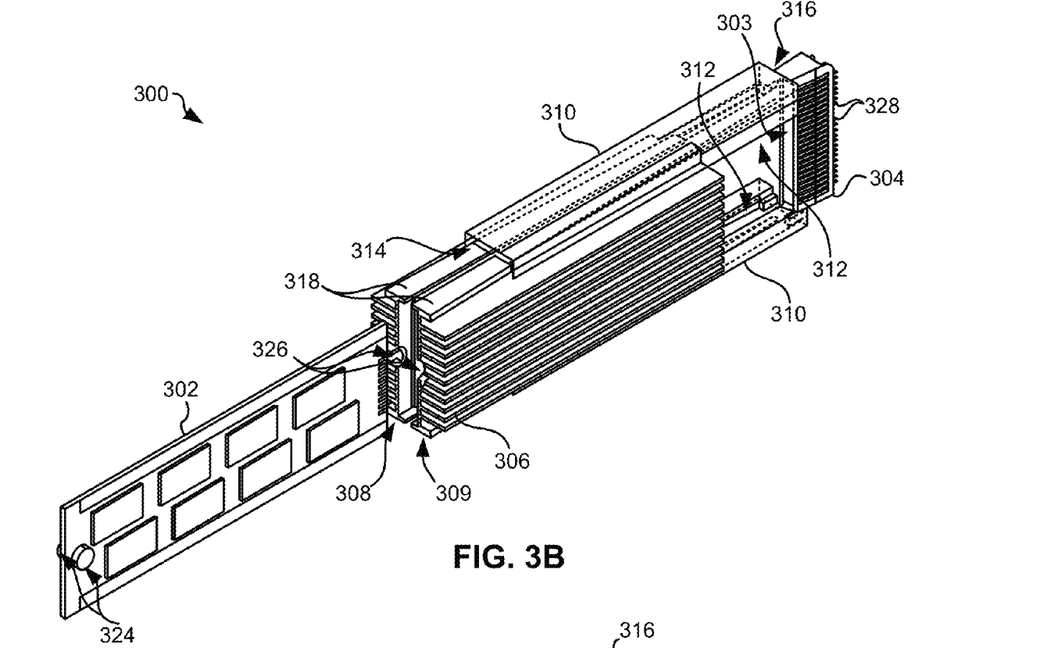
FIG. 3B is a perspective view of a card connector system and a non-inserted electronics card, in accordance with one embodiment.
Figure 3C:
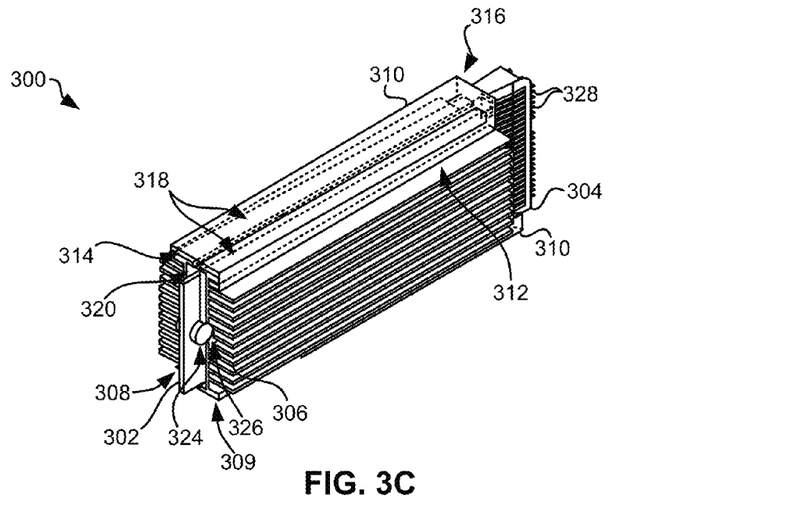
FIG. 3C is a perspective view of a card connector system and an inserted electronics card, in accordance with one embodiment.

FIGS. 3A-3C depict a system 300 in accordance with one embodiment. As an option, the present system 300 may be implemented in conjunction with features from any other embodiment listed herein, such as those described with reference to the other FIGS. Of course, however, such system 300 and others presented herein may be used in various applications and/or in permutations which may or may not be specifically described in the illustrative embodiments listed herein. Further, the system 300 presented herein may be used in any desired environment.

FIG. 3A is an exploded view of system 300. System 300 includes opposing slide plates, e.g., a first slide plate 308 and a second slide plate 309.

System 300 includes opposing guide blocks 310 which are configured to receive the slide plates 308, 309 therebetween and urge, e.g., push, the slide plates 308, 309 together during a relative motion between the slide plates 308, 309 and the guide blocks 310.

The guide blocks 310 may each have a track 312 for receiving mating portions 318 of the slide plates 308, 309. The track 312 of each guide blocks 310 each may have a generally trapezoidal cross sectional profile, where as shown in system 300, the track 312 becomes narrower from the first end 314 towards the second end 316 of the associated guide block 310.

The mating portions 318 of the slide plates 308, 309 each may also have a generally trapezoidal profile. For example, in FIGS. 3A-3C, the mating portions 318 each have a generally trapezoidal profile when viewed from above or below, respectively.

System 300 may include an optional thermal interface material 322. The thermal interface material 322 may be coupled to opposing inner faces of the slide plates 308, 309. The thermal interface material 322 may promote thermal dissipation conductivity in system 300, e.g., by establishing a heatsink, as will be described elsewhere herein. The thermal interface material 322 may include, e.g., non-liquid graph material, a non-phase changing gap pad material, a thermal interface material of a type known in the art, etc.

According to preferred embodiments, the thermal interface material 322 may include one or more materials that prevent the thermal interface material 322 from sticking and/or smearing when contacted by a component of system 300, e.g. the electronics card 302.

The generally trapezoidal profile of the mating portions 318 may encourage the thermal interface material 322 to form a good contact with the electronics card 302, e.g., with an applied normal force as the slide plates 308, 309 are urged together when the electronics card 302 is inserted, e.g. for electrical coupling with an interface connector 304.

The electronics card 302 may be an electronics card of a type known in the art, e.g. a solid state drive (SSD), an audio card, or any other type of electronics card. The electronics card 302 may include one or more hooks 324 for engaging with one or more notches 326 of the slide plates 308, 309, as will be described in greater detail herein. The hooks 324 may also serve as a grab tab for user removal/ejection of the electronics card 302 when inserted in system 300.

The interface connector 304, which may or may not be present as part of the system 300 in various embodiments, may be coupled to at least one of the guide blocks 310 and the slide plates 308, 309. According to various embodiments, the coupling between the interface connector 304 and at least one of the guide blocks 310 may include, e.g., a permanently fixed coupling, a press fit coupling, a coupling of a type known in the art, etc.

The interface connector 304 includes a receptacle 303 for receiving an inserted electronics card. The receptacle 303 may include electrical connectors (not shown) of conventional design for electrically coupling with the electronics card 302. The receptacle may preferably be configured to accept and/or electrically couple with a card edge.

According to further embodiments, the receptacle may be configured to accept various components, e.g., an electronics card with leads other than leads on a card edge, a SSD with multiple branching connector coupling portions, more than one electronics card 302, etc.

The interface connector 304 may include electrical connectors 328 on another end thereof, e.g., for electrical coupling with a circuit board, etc.

The interface connector 304 also includes a plurality of leads (not shown) connecting the electrical connectors of the receptacle 303 that engage an inserted electronics card 302 with the electrical connectors 328. The leads connecting the electrical connectors of the receptacle 303 to the electrical connectors 328 may be copper, gold, aluminum, and/or a conductive contact material of a type known in the art.

Illustrative embodiments of an electronics card being inserted in system 300 are shown in FIG. 3B-3C and will now be described below. FIGS. 3B-3C include partial side views of system 300 with a non-inserted (see FIG. 3B) and inserted (see FIG. 3C) electronics card 302.

To insert the electronics card into system 300, a user may position the electronic card 302 between the thermal interface material 322 and the slide plates 308, 309, e.g., as shown in FIG. 3B.

Upon insertion of an electronics card into system 300, e.g., insertion between the thermal interface material 322 layers; insertion between the slide plates 308, 309; insertion at the first end 314 towards a second end 316 of the associated guide blocks 310; etc., the creation of a relative motion between the slide plates and the guide blocks causes the opposing guide blocks 310 to receive the slide plates therebetween and urge, e.g., push, the slide plates 308, 309 together. As previously described, the slide plates 308, 309 may be urged together due to the orthogonal and/or narrowing profile from the first end 314 towards the second end 316, of the associated, e.g., guide blocks 310, mating portions 318, etc., of the system 300.

According to one approach, system 300 may include ramp and lead-in components to guide the insertion of the electronics card 302 between the thermal interface material 322 and the slide plates 308, 309. The extended (non-inserted) thermal interface material 322 and the slide plates 308, 309 may be spring loaded, e.g., spring loaded in a direction away from the interface connector 304, in order to promote a smooth/assisted insertion and removal of the electronics card 302.

As the electronics card is inserted into system 300, it may slide freely between thermal interface material 322 layers on either side, until the hooks 324 of the electronics card 302 engage with one or more notches 326 of the slide plates 308, 309. As the hooks 324 engage with notches 326 of the slide plates 308, 309, the inserted electronics card 302 may thereby become fixed in a desired position between and with respect to the interface material 322 and the slide plates 308, 309. The extended, e.g., still partially extended by the optionally applied spring load, and conjoined electronics card 302, interface material 322, and slide plates 308, 309 may then be further inserted, e.g., in a direction from the first end 314 towards the second end 316, to electrically couple the electronics card 302 with the interface connector 304.

As the conjoined electronics card 302, interface material 322, and slide plates 308, 309 are further inserted down the guide blocks 310, e.g. guided by the receiving mating portions 318 of the slide plates 308, 309 being positioned and guided within track 312, the thermal interface material 322 and the slide plates 308, 309 may be urged together toward the electronics card 302.

As the thermal interface material 322 and the slide plates 308, 309 are urged, e.g., pushed, together toward the electronics card 302, normal force may be applied to the electronics card 302 at one or more contact points. According to preferred embodiments, the contact between the thermal interface material 322 and the electronics card may be at least at each of the chip surfaces of the electronics card 302, and any associated EMI grounding strips to provide EMI shielding, as will be described in greater detail elsewhere herein.

According to further embodiments, the thermal interface material 322 may contact the entire outer surface of the electronics card 302. The applied normal force contact may preferably establish thermal conductivity between the electronics card 302 and/or chips on the electronics card and the thermal interface material 322.

The normal force applied to the inserted electronics card 302 by the thermal interface material 322 may enhance heat transfer from the electronics card 302.

For example, heat accumulated on the thermal interface material 322 may be thermally diffused across inner portions of the slide plates 308, 309, to optional heat spreader fins 306 extending from at least one of the slide plates 308, 309.

Figure 7:
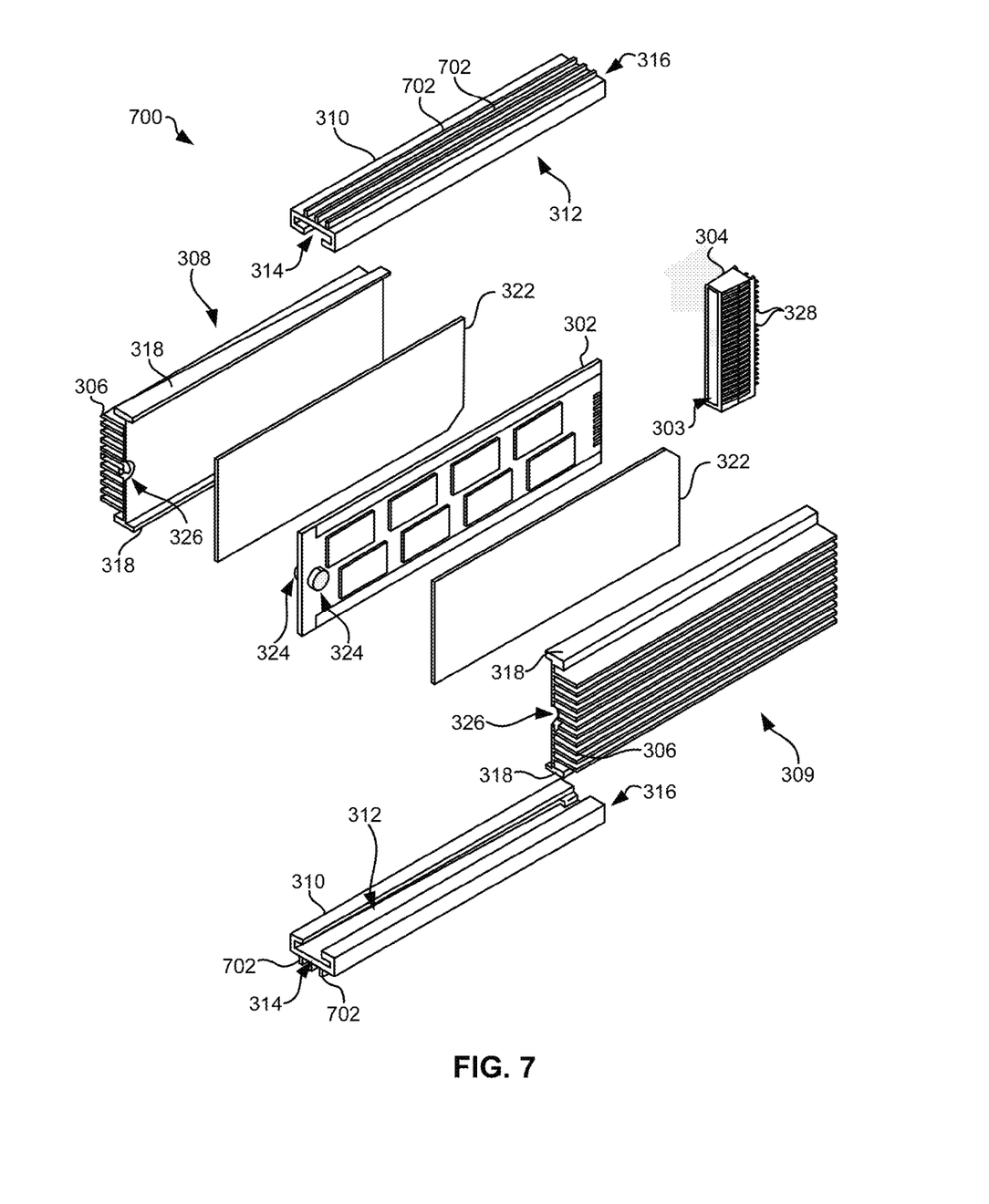
FIG. 7 is an exploded view of a card connector system and an electronics card, in accordance with one embodiment.

According to further embodiments, system 300 may include fins extending from at least one of the guide blocks 310. For example, at least one of the guide blocks 310 may include fins that extend in a direction that is perpendicular to the fins 306 which are shown extending from the slide plates 308, 309 in FIGS. 3A-3C. According to another example, referring now to a card connector system 700 of FIG. 7, guide blocks 310 include fins 702 that extend in a direction that is perpendicular to the fins 306 which are shown extending from the slide plates 308, 309.

The heat spreader fins 306 may diffuse heat, e.g., heat that is generated during operation of electronics card 302, away from system 300. Diffusing heat away from system 300 may thereby keep electronics card 302 from reaching an undesirable temperature, e.g., a temperature that may damage and/or degrade normal functionality of electronics card 302, a temperature undesirable in a card edge connector system for reasons known in the art, etc.

According to various embodiments, system 300 and/or an apparatus in which system 300 is installed may further include a fan (not shown) for inducing air flow across the heat spreader fins 306 of the slide plates 308 in a direction parallel to the first end 314.

System 300 may position the electronics card during insertion such that the inserted electronics card 302 experiences EMI shielding. For example, the slide plates 308, 309 and the guide blocks 310 may encircle the inserted electronics card 302 to provide EMI shielding.

Accordingly, the slide plates 308, 309 and/or guide blocks 310 may be constructed of an EMI suppressing (shielding) material. For example, the slide plates 308, 309 may include, e.g., aluminum, copper, an EMI absorbing and/or reflecting material of a type known in the art, etc. In another approach, the slide plates 308, 309 and/or guide blocks 310 may include, e.g., an electrically conductive material of a type known in the art, where the electrically conductive material is preferably electrically grounded.

The upper and lower mating portions 318 of the first of the slide plates 308 extend towards mating portions 318 of the second of the slide plates 309, thereby defining a cavity 320 between the slide plates 308, 309, e.g., upon the normal force being applied to the electronics card 302. The cavity 320 may be encircled by opposing faces of the slide plates 308, 309 and the mating portions 318. The encircling of the electronics card 302 may provide EMI shielding of the electronics card 302.

According to preferred embodiments, the slide plates 308, 309 and the guide blocks 310 may further form a shielded heatsink and/or shell around the inserted electronics cards 302, e.g., where only the thermal interface material 322 contacts the electronics cards 302 (not including the contact between the hooks 324 and the notches 326 of the slide plates 308, 309), to provide EMI shielding of the inserted electronics card 302.

According to further embodiments, system 300 may fully enclose, e.g. via a closing door or the like (where the door is of an EMI shielding material) near the first end 314 when the electronics card 302 is inserted into system 300 to provide further EMI shielding.

In embodiments where the slide plates 308, 309 and the guide blocks 310 are coupled together, both the slide plates 308, 309 and the guide blocks 310 may preferably be electrically conductive and grounded, e.g., to promote EMI shielding of the electronics card 302, to prevent the transmission of accumulated radio frequency (RF) signals, etc.

It should be noted that the configurations and/or EMI suppressing material of the slide plates 308, 309 and/or the guide blocks 310 may each vary depending on the preferred embodiment. For example, where EMI shielding configurations are not preferred, the periphery of the slide plates 308, 309 may not be completely co-extensive with the periphery of the electronics cards 302, e.g., where the electronics card 302 is not completely encapsulated by the slide plates 308, 309.

It should further be noted that, the length of the guide blocks 310 in a direction from the first end 314 to the second end 316 may be shorter or longer than those illustrated in system 300, depending on the embodiment. For example, the length of the guide blocks 310 in a direction from the first end 314 to the second end 316 may be half the length of the slide plates 308, 309 in the same direction. In another example, the orthogonal portions of the guide blocks 310 and/or the slide plates 308, 309 may be less than the length of the guide blocks 310 and/or the slide plates 308, 309 in the same direction (respectively).

According to various embodiments, the shielded heatsink and/or shell formed by the slide plates 308, 309 and the guide blocks 310 may establish a service friendly card connector system. For example, when servicing the system 300, the majority of the system 300 components may be, e.g., easily accessed, easily detachable, easily serviceable by a means known in the art, etc.

Figure 4A:
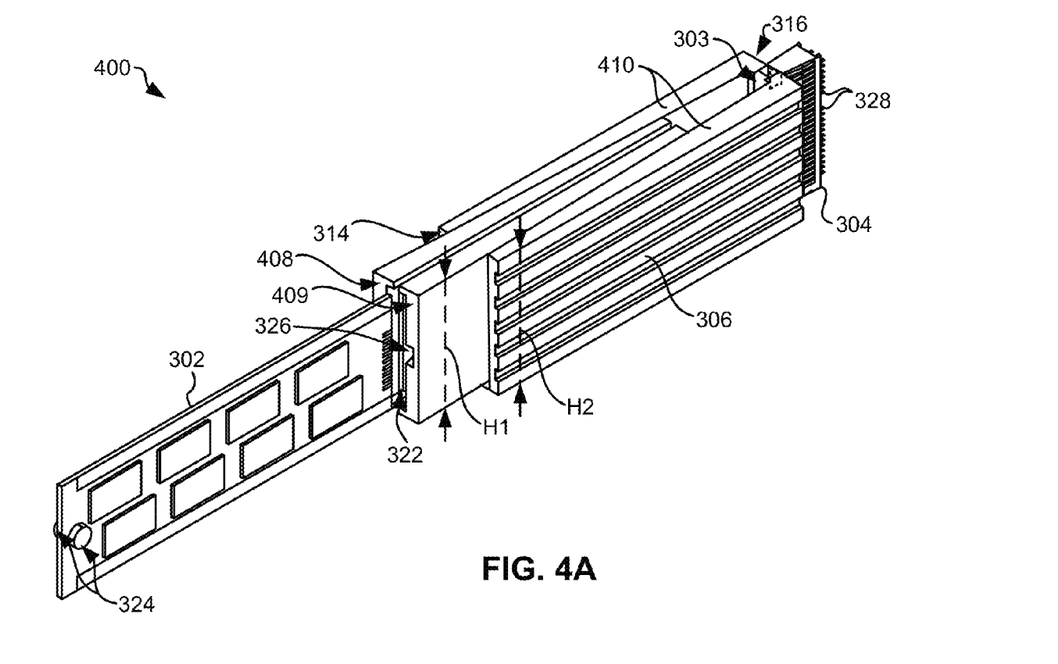
FIG. 4A is a perspective view of a card connector system and a non-inserted electronics card, in accordance with one embodiment.
Figure 4B:
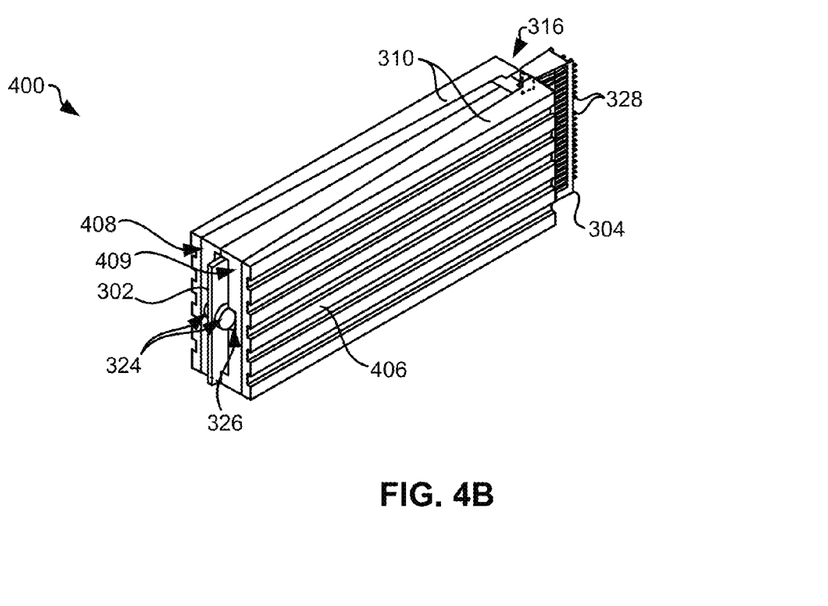
FIG. 4B is a perspective view of a card connector system and an inserted electronics card, in accordance with one embodiment.

Referring now to FIG. 4A-4B, system 400 is a card edge connector system with functionalities and/or components similar to system 300. Accordingly, similar components of system 400 are labeled the same as in system 300.

FIGS. 4A-4B depict a system 400 in accordance with one embodiment. As an option, the present system 400 may be implemented in conjunction with features from any other embodiment listed herein, such as those described with reference to the other FIGS. Of course, however, such system 400 and others presented herein may be used in various applications and/or in permutations which may or may not be specifically described in the illustrative embodiments listed herein. Further, the system 400 presented herein may be used in any desired environment.

System 400 includes slide plates 408, 409. The slide plates 408, 409 may each have a generally trapezoidal cross sectional profile, each of the slide plates 408, 409 becoming thinner from a first end 314 towards a second end 316 of the associated slide plate 408, 409, e.g., to urge the slide plates 408, 409 together during the insertion of the electronics card 302.

System 400 also includes guide blocks 410. The guide blocks 410 may be configured to engage outer surfaces of the slide plates 408, 409, e.g., the largest outer surfaces of the slide plates 408, 409. Engaging the largest outer surfaces of the slide plates 408, 409 may establish a thermal conduction path from the thermal interface material 322 to the fins 306 of the guide blocks 410, e.g., to maintain a thermally cool system 400.

For example, heat generated on the electronics card 302 may pass from the electronics card 302 to the thermal interface material 322, across the slide plates 408, 409, and across the guide blocks 410 to be thermally diffused out of the fins 306 and away from system 400.

According to preferred embodiments, the slide plates 408, 409 may have a height H1 in a direction substantially perpendicular to the direction of insertion of the electronics card 302 that is substantially similar to the height H2 of the guide blocks 410 as measured in the same direction.

According to further embodiments, the height H1 may be greater than or less than height H2.

Figure 5:
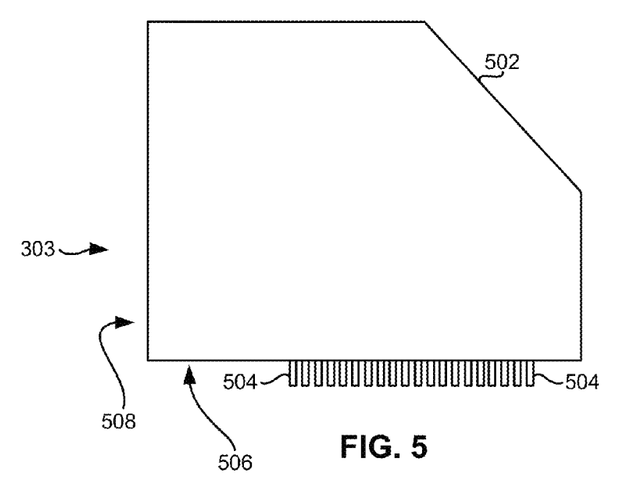
FIG. 5 is a perspective view of an orthogonal card connector, in accordance with one embodiment.

Although embodiments described herein include interface connectors, e.g., 304, that may be electrically coupled, e.g., to a circuit board, in a direction substantially similar to the direction the electronics card is inserted (see FIGS. 3B-3C), according to further embodiments, the interface connector of embodiments described herein may include an orthogonal interface connector (see FIG. 5).

FIG. 5 depicts an orthogonal interface connector 502 in accordance with one embodiment. As an option, the present orthogonal interface connector 502 may be implemented in conjunction with features from any other embodiment listed herein, such as those described with reference to the other FIGS. Of course, however, such orthogonal interface connector 502 and others presented herein may be used in various applications and/or in permutations which may or may not be specifically described in the illustrative embodiments listed herein. Further, the orthogonal interface connector 502 presented herein may be used in any desired environment.

Figure 6:
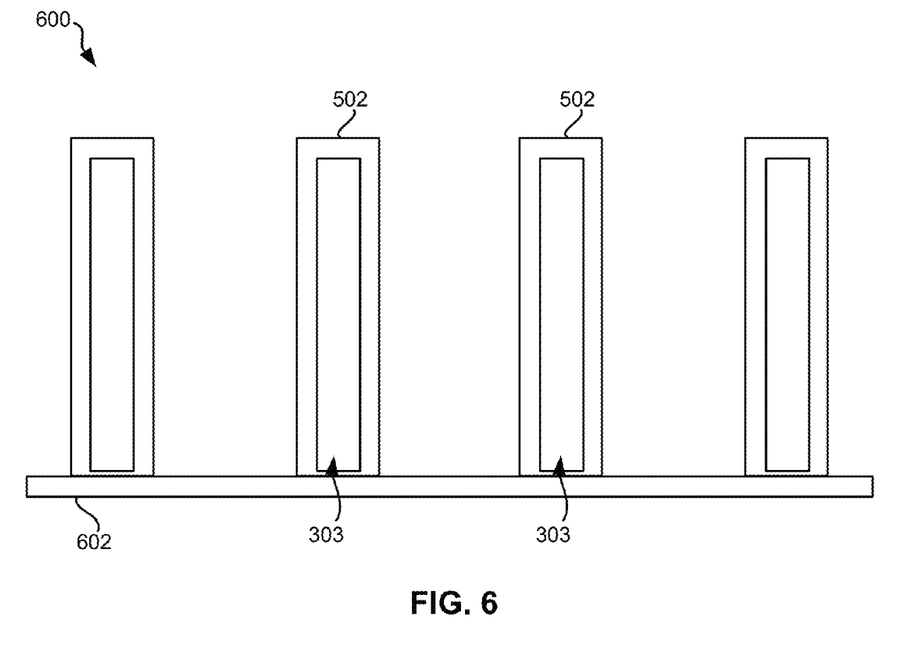
FIG. 6 is a perspective view of multiple orthogonal card connectors mounted on a circuit board, in accordance with one embodiment.

Each orthogonal interface connector 502 may have a first end 506 having a plurality of electrical connectors 504 configured for coupling with a circuit board (see FIG. 6). The electrical connectors 504 may include copper, gold, and/or a conductive contact material of a type known in the art.

Each orthogonal interface connector 502 additionally may include a second end 508 oriented about orthogonal to the first end 506. The second end 508 may have a plurality of electrical connectors (not shown) configured for coupling directly with a card edge of an electronic device, e.g., electronics card 302. Similar to the electrical connectors 504, the electrical connectors may be copper, gold and/or a conductive contact material of a type known in the art.

Orthogonal interface connector 502 also includes a plurality of leads (not shown) connecting the electrical connectors 504 to the electrical connectors that engage an inserted electronics card (not shown). The leads connecting the electrical connectors 504 to the electrical connectors of the second end 508 may be copper, gold, aluminum, and/or a conductive contact material of a type known in the art. According to various embodiments, portions of all of the leads may extend along a common plane in orthogonal interface connector 502, e.g., along a printed circuit board. Ensuring that the leads of orthogonal interface connector 502 extend along a common plane may ensure that orthogonal interface connector 502 remains spatially compact e.g. to increase component density, etc.

According to other embodiments, portions of some leads may extend along a common plane in orthogonal interface connector 502, while portions of some of the leads may extend along uncommon planes in orthogonal interface connector 502. According to yet other embodiments, portions of all of the leads may extend along uncommon planes in orthogonal interface connector 502.

Orthogonal interface connector 502 may further include at least one ground plane (not shown) extending generally parallel to the leads. The number of ground planes included in each orthogonal interface connector 502 may vary depending on the preferred embodiment. Each of the one or more ground pins of the ground planes may be of a same and/or different design, e.g., shape, orientation therewith, etc., as the electrical connectors 504. Designing one or more ground pins of the ground planes to be substantially similar to the design of the electrical connectors 504 may advantageously ensure a spatially compact orthogonal interface connector 502.

It should be noted that the plurality of leads connecting the electrical connectors 504 to the electrical connectors of the second end 508 are not readily visible in FIGS. 5-6 because they reside on an inner portion of orthogonal interface connector 502, e.g. that is enclosed by a housing etc. The housing may preferably be an injected molded plastic housing, but according to other embodiments may be e.g., a cast aluminum housing, a composite housing, of a conventional housing material of a type known in the art, etc. Furthermore the housing may be configured in a way that prevents functionality problems in orthogonal interface connector 502 e.g. electrical shorting, electrical isolation, system thermal irregularities, etc.

With continued reference to FIG. 5, orthogonal interface connector 502 may additionally include shielding, e.g., backplanes, reference planes for signal quality measures, etc., within the orthogonal interface connector 502. Such shielding may furthermore extend into a circuit board (see FIG. 6) to which the orthogonal interface connector 502 may be electrically coupled.

FIG. 6 is a side view of system 600 which includes multiple orthogonal interface connectors 502 coupled to a circuit board.

FIG. 6 depicts a system 600 in accordance with one embodiment. As an option, the present system 600 may be implemented in conjunction with features from any other embodiment listed herein, such as those described with reference to the other FIGS. Of course, however, such system 600 and others presented herein may be used in various applications and/or in permutations which may or may not be specifically described in the illustrative embodiments listed herein. Further, the system 600 presented herein may be used in any desired environment.

System 600 includes multiple orthogonal interface connectors 502 coupled to a circuit board 602. Each of the orthogonal interface connectors 502 may preferably be spaced apart from one another to allow air to pass between the orthogonal interface connectors 502 and any card edge connector system coupled to the orthogonal interface connectors 502.

For example, according to one approach, orthogonal interface connectors 502 may be implemented in system 300 in place of the interface connector 304. The fins 306 of each slide plate 308, 309 in such an approach may be spaced apart from fins 306 of a different slide plate 308, 309 so that airflow may efficiently pass between each of the card edge connector systems, and prevent overheating.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
opposing slide plates; and
opposing guide blocks, each guide block being configured to receive both of the slide plates therebetween and push the slide plates together during a relative motion between the slide plates and the guide blocks.

2. The system as recited in claim 1, wherein the guide blocks each have a track for receiving mating portions of the slide plates, each track becoming narrower from a first end towards a second end of the associated guide block.

3. The system as recited in claim 2, wherein the mating portions each have a generally trapezoidal profile.

4. The system as recited in claim 2, wherein the mating portions of a first of the slide plates extend towards mating portions of a second of the slide plates, thereby defining a cavity between the slide plates.

5. The system as recited in claim 2, comprising a thermal interface material coupled to opposing inner faces of the slide plates.

6. The system as recited in claim 1, wherein the guide blocks each have a generally trapezoidal cross sectional profile, each of the guide blocks becoming thicker from a first end towards a second end of the associated guide block.

7. The system as recited in claim 6, wherein the slide plates each have a generally trapezoidal cross sectional profile, each of the slide plates becoming thinner from a first end towards a second end of the associated slide plate.

8. The system as recited in claim 6, wherein the guide blocks engage largest outer surfaces of the slide plates.

9. The system as recited in claim 6, comprising a thermal interface material coupled to opposing inner faces of the slide plates.

10. The system as recited in claim 1, comprising fins extending from at least one of the slide plates.

11. The system as recited in claim 1, comprising an interface connector coupled to at least one element selected from a group consisting of: one or more of the guide blocks and one or more of the slide plates, the interface connector having electrical connectors on opposite ends thereof.

12. The system as recited in claim 1, wherein the slide plates are constructed of an electromagnetic interference suppressing material.

13. The system as recited in claim 1, wherein the guide blocks are constructed of an electromagnetic interference suppressing material.

14. A system, comprising
opposing slide plates;
opposing guide blocks configured to receive the slide plates therebetween and push the slide plates together during a relative motion between the slide plates and the guide blocks; and
fins extending from at least one of the guide blocks.

15. A system, comprising:
opposing slide plates;
a thermal interface material coupled to opposing inner faces of the slide plates;
opposing guide blocks for receiving the slide plates therebetween and pushing the slide plates together during a relative motion between the slide plates and the guide blocks; and
an interface connector coupled to at least one element selected from a group consisting of: one or more of the guide blocks and one or more of the slide plates, the interface connector having electrical connectors on opposite ends thereof.

16. The system as recited in claim 15, wherein the guide blocks each have a track for receiving mating portions of the slide plates, each track becoming narrower from a first end towards a second end of the associated guide block for changing a distance between the slide plates during the relative motion between the slide plates and the guide blocks.

17. The system as recited in claim 16, wherein the mating portions each have a generally trapezoidal profile.

18. The system as recited in claim 15, wherein the guide blocks each have a generally trapezoidal cross sectional profile.

19. The system as recited in claim 15, comprising fins extending from a component selected from a group consisting of: at least one of the slide plates and at least one of the guide blocks.

20. The system as recited in claim 15, wherein the thermal interface material extends along each of the opposing inner faces between the opposing inner faces.

* * * * *